United States Patent
Won et al.

(10) Patent No.: US 12,022,661 B2
(45) Date of Patent: Jun. 25, 2024

(54) TWO-TERMINAL MEMORY DEVICE, A METHOD FOR MANUFACTURING THE SAME, AND A SEMICONDUCTOR DEVICE INCLUDING A TWO-TERMINAL MEMORY DEVICE

(71) Applicants: HYUNDAI MOTOR COMPANY, Seoul (KR); KIA CORPORATION, Seoul (KR)

(72) Inventors: Ui-Yeon Won, Ansan-si (KR); Jong-Seok Lee, Suwon-si (KR); Sang-Hyeok Yang, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 210 days.

(21) Appl. No.: 17/491,012

(22) Filed: Sep. 30, 2021

(65) Prior Publication Data
US 2023/0024729 A1 Jan. 26, 2023

(30) Foreign Application Priority Data
Jul. 26, 2021 (KR) .......... 10-2021-0097829

(51) Int. Cl.
*H10B 53/30* (2023.01)
*H01L 29/51* (2006.01)
*H01L 49/02* (2006.01)

(52) U.S. Cl.
CPC ............. *H10B 53/30* (2023.02); *H01L 28/60* (2013.01)

(58) Field of Classification Search
CPC ......... H10B 53/30; H10B 51/30; H01L 28/60; H01L 29/685; H01L 29/516; H01L 29/78391; H01L 29/8615
See application file for complete search history.

(56) References Cited

U.S. PATENT DOCUMENTS

| 5,623,439 A | 4/1997 | Gotoh et al. |
| 5,833,745 A | 11/1998 | Atsuki et al. |
| 10,374,054 B2 | 8/2019 | Yoo |
| 10,679,688 B2 | 6/2020 | Rakshit et al. |
| 2004/0061153 A1* | 4/2004 | Misewich ............ H10B 51/00 257/295 |
| 2019/0318775 A1 | 10/2019 | Rakshit et al. |

FOREIGN PATENT DOCUMENTS

| JP | H09213905 A | 8/1997 |
| JP | 3299837 B2 | 7/2002 |
| KR | 101148798 B1 | 5/2012 |
| KR | 20140107152 A | 9/2014 |
| KR | 20190130460 A | 11/2019 |

* cited by examiner

*Primary Examiner* — David Vu
(74) *Attorney, Agent, or Firm* — Lempia Summerfield Katz LLC

(57) ABSTRACT

A two-terminal memory device including: a substrate; a source and a drain formed to face each other on an upper surface of the substrate; a ferroelectric layer connected to the source and the drain and formed between the source and the drain; and an extended drain extending from the drain and laminated on the ferroelectric layer. The two-terminal memory device may be applied as a cross-point type and neuromorphic device capable of implementing multi-resistance levels with multi-layer switchable resistance layers.

9 Claims, 16 Drawing Sheets

Bare Si wafer

Bare Si wafer

Semiconductor deposition

Semiconductor deposition

Source / Drain deposition

Source / Drain deposition

Ferroelectric layer deposition

Ferroelectric layer deposition

Ferroelectric layer etching

Ferroelectric layer etching

TWO-TERMINAL MEMORY DEVICE, A METHOD FOR MANUFACTURING THE SAME, AND A SEMICONDUCTOR DEVICE INCLUDING A TWO-TERMINAL MEMORY DEVICE

CROSS-REFERENCE TO RELATED APPLICATION

This application claims priority to Korean Patent Application No. 10-2021-0097829, filed on Jul. 26, 2021, which is incorporated herein by reference in its entirety.

BACKGROUND OF THE DISCLOSURE

Field of the Disclosure

The present disclosure relates to a memory device operated with two terminals and a method for manufacturing the same.

Description of Related Art

As a next-generation semiconductor technology, a ferroelectric material-based device, and a cross-point type emerging non-volatile memory technology are highlighted (e.g., of interest). Further, the expanding interest in artificial intelligence research is now drawing attention not only to the accuracy of semiconductor technology, but also to a neuromorphic technology for solving problems such as the disadvantages of high power consumption generated upon implementation of semiconductor technology and high power consumption generated upon implementation of 5G communication to connect the technology. Such a neuromorphic device may have various resistance levels depending upon a learned state, and output various voltages or currents depending upon the resistance levels.

A ferroelectric, as a material with polarization by itself (spontaneous polarization, Ps) even without an external electric field, means a material in which a direction of polarization is switchable by an external electric field, and which loses the corresponding polarization property at a curie temperature (phase transition temperature) or more. Examples of a type of ferroelectric may be as follows.

Barium titanate ($BaTiO_3$) is the first discovered perovskite-structured ferroelectric.

Lead zirconate titanate (PZT, ($PbZrxTi1-O_3$)) has a higher sensitivity and a higher operating temperature than those of the barium titanate. It is also the most commonly used piezoceramic due to a physical strength, a chemical inertness, customizability, and a relatively low manufacturing cost.

Hafnium Oxide ($HfO_2$) is applied to a high-K metal gate in an Intel's CPU due to the high dielectric constant property. Relatively recently (2011), it has been reported that the property of the ferroelectric may be maintained even at a smaller thickness (~10 nm) than that of the conventional material (~130 nm). Such a property is related to the composition of impurities, such as Al, Zr, and Si, and the property of the ferroelectric is also confirmed by adjusting the crystallization of the pure hafnium oxide.

A ferroelectric memory, as a nonvolatile memory capable of both reading and writing, has an excellent information retention property, but may not be successfully commercialized due to the limitations to fineness and the like. A ferroelectric memory is largely classified into a capacitor type and a field effect transistor (FET) type depending upon an application structure.

The capacitor type has the same structure as that of a dynamic random access memory (DRAM) but has a structure in which a capacitor for storing information is substituted with ferroelectric and stores a direction of polarization in which information of 0 and 1 is stored by an applied pulse. Further, the capacitor type always applies+pulse and detects the information using a sense amplifier in a read process, has a destructive read property in which original information is destroyed, and requires a rewrite process.

The FET type has a structure that is unable to be applied to the resistance type memory because the direction of the polarization and the resistance property do not match with each other. Further, the FET type has a structure substituting a gate oxide film of the FET with a ferroelectric.

As illustrated in FIG. 1, the FET type is formed in a form in which a source 13 and a drain 14 are formed on both sides of a semiconductor layer 12 on a substrate 11; a ferroelectric 15 covers the source 13, the drain 14, and the semiconductor layer 12; and a gate 16 is formed on the ferroelectric 15 to correspond to a channel layer. Therefore, the FET type determines 0 and 1 with a conductance difference that occurs between the source 13 and the drain 14 and does not cause the inversion of the polarization upon the read operation, thereby achieving a device with high durability compared to the capacitor type.

The FET type does not require a capacitor, and therefore, is advantageous for increasing the integration of the device, and advantageous for a high linear operation of the conductance through a fast speed compared to a flash memory and the application of a gate pulse but has a disadvantage of being operated with 3 terminals.

The ferroelectric memory has a high speed, high durability, and low power consumption, and therefore, has a high possibility for the application as a synaptic device in neuromorphic applications.

In the related art, the research is being conducted to substitute the commercial memory by developing a ferroelectric with a structure of the capacitor type or the FET type.

However, since the capacitor type structure has the properties in which the polarization adjusted by the pulse is not proportional to the change in resistance, the sense amplifier is required for the read operation for the polarization storage state, and the storage state is not preserved when the read operation is performed, it is difficult to apply the synaptic device in which the storage state is fundamental to learning.

Further, the FET type structure has the linear electrical conductance property that is an important property of the synaptic device by the gate pulse but may not be applied to a cross-point array structure due to the 3-terminal operation property through the application of the gate pulse, thereby largely increasing integration and array complexity.

The contents described in Description of Related Art are to enhance the understanding of the background of the present disclosure and may include what is not previously known to those having ordinary skill in the art to which the present disclosure pertains.

SUMMARY OF THE DISCLOSURE

The present disclosure has been made in an effort to solve the above problems associated with the related art, and an object of the present disclosure is to provide a two-terminal memory device, a method for manufacturing the same, and a semiconductor device including the two-terminal memory device, which may be applied as a cross-point type and neuromorphic device capable of implementing multi-resistance levels with multi-layer switchable resistance layers.

According to one aspect of the present disclosure, a two-terminal memory device includes: a substrate; a source and a drain formed to face each other on an upper surface of the substrate; a ferroelectric layer connected to the source and the drain and formed between the source and the drain; and an extended drain extending from the drain and laminated on the ferroelectric layer.

Further, the extended drain covers an upper region of the drain and the ferroelectric layer of a region between the source and the drain.

Further, the ferroelectric layer is laminated in a form of covering the substrate, the source, and the drain other than the extended drain.

Here, the ferroelectric layer is made of a material with a spontaneous polarization property.

More specifically, the ferroelectric layer is made of an oxide film consisting of any one material of polyvinylidene fluoride (PVDF), or an oxide material, such as hafnium zirconium oxide ($HfZrO_2$), haflanthanum oxide ($La:HfO_2$), aluminum (Al):hafnium oxide ($HfO_2$), or silicon (Si):hafnium oxide ($HfO_2$).

Meanwhile, the two-terminal memory device further includes a semiconductor layer connected to the source and the drain, and laminated on the substrate, in which the ferroelectric layer is laminated on an upper surface of the semiconductor layer.

Further, the polarization of the ferroelectric layer is adjusted by an input voltage pulse applied to the drain.

Furthermore, an electrical conductance of a channel region between the source and the drain is linearly changed depending upon a change in the input voltage pulse.

Next, according to one aspect of the present disclosure, a semiconductor device includes: the two-terminal memory device, a metal oxide semiconductor field effect transistor (MOSFET) source sharing a source as an intermediate electrode and formed on the substrate to face the intermediate electrode; an insulator formed between the intermediate electrode and the MOSFET source; and a gate formed on the insulator.

Next, according to another aspect of the present disclosure, a two-terminal memory device includes: a substrate; an extended drain extending from a drain and a lower surface of the drain, and laminated on the substrate; a ferroelectric layer connected to the drain, and covering the extended drain and the substrate; and a source laminated on the ferroelectric layer to face the drain.

Here, the ferroelectric layer is made of an oxide film consisting of any one material of polyvinylidene fluoride (PVDF), or an oxide material, such as hafnium zirconium oxide ($HfZrO_2$), haflanthanum oxide ($La:HfO_2$), aluminum (Al):hafnium oxide ($HfO_2$), or silicon (Si):hafnium oxide ($HfO_2$).

Further, the two-terminal memory device may further include a semiconductor layer connected to the source and the drain and laminated on the ferroelectric layer.

Next, according to another aspect of the present disclosure, a semiconductor device includes: the two-terminal memory device; a metal oxide semiconductor field effect transistor (MOSFET) source sharing a source as an intermediate electrode, and disposed to face the intermediate electrode; a gate formed on the substrate; and an insulator covering the gate and formed between the intermediate electrode and the MOSFET source.

Further, according to one aspect of the present disclosure, a method for manufacturing a two-terminal memory device includes: forming a semiconductor layer on a substrate; forming a source and a drain connected to the semiconductor layer and facing each other on the substrate; laminating a ferroelectric layer covering the substrate, the semiconductor layer, the source, and the drain; etching a region of the ferroelectric layer covering the drain; and forming an extended drain extending from an upper surface of the drain, and covering a partial region of the ferroelectric layer.

Further, the partial region of the ferroelectric layer is a region between the source and the drain.

The present disclosure provides a ferroelectric synaptic device operable with two terminals unlike the general three-terminal-based ferroelectric-based synaptic device, which may have the structure in which the drain extends to the upper portion of the ferroelectric layer to overlap the ferroelectric layer, thereby improving the increase in complexity of the structure. and the presently described device may be applied to the cross-point structure like the resistance type memristor. Therefore, it is determined that integration may be improved upon forming an array.

The present disclosure may improve the disadvantage of the ferroelectric device, such as the sense amplifier or the destructive read operation, and gradually change conductance by the applied voltage. Therefore, the two-terminal ferroelectric synaptic device may be the new alterative in the neuromorphic application research field.

The corresponding structure does not require new additional process other than the ferroelectric process in the conventional silicon MOSFET process, thereby being easily applied to the industry.

Upon implementing the cross-point array, to prevent the leakage current, the component of the selector other than the memory is added, and upon applying the 1T1R structure sharing the electrode described earlier, many processes may be shared between the memory and the MOSFET, thereby efficiently decreasing the cost required for the process.

BRIEF DESCRIPTION OF THE DRAWINGS

FIGS. 12A-17B sequentially illustrate a method for manufacturing the memory device according to the first embodiment of the present disclosure, in which FIGS. 12A, 13A, 14A, 15A, 16A, and 17A illustrate shapes of side surfaces of the memory device, and FIGS. 12B, 13B, 14B, 15B, 16B, and 17B illustrate shapes of upper surfaces thereof.

DESCRIPTION OF SPECIFIC EMBODIMENTS

To fully understand the present disclosure, the operational advantages of the present disclosure, and the object achieved by the practice of the present disclosure, reference should be made to the accompanying drawings illustrating embodiments of the present disclosure and the contents described in the accompanying drawings.

In describing embodiments of the present disclosure, a description of well-known techniques or repetitive descriptions that may unnecessarily obscure the gist of the present disclosure has been decreased or omitted.

Figure 2:
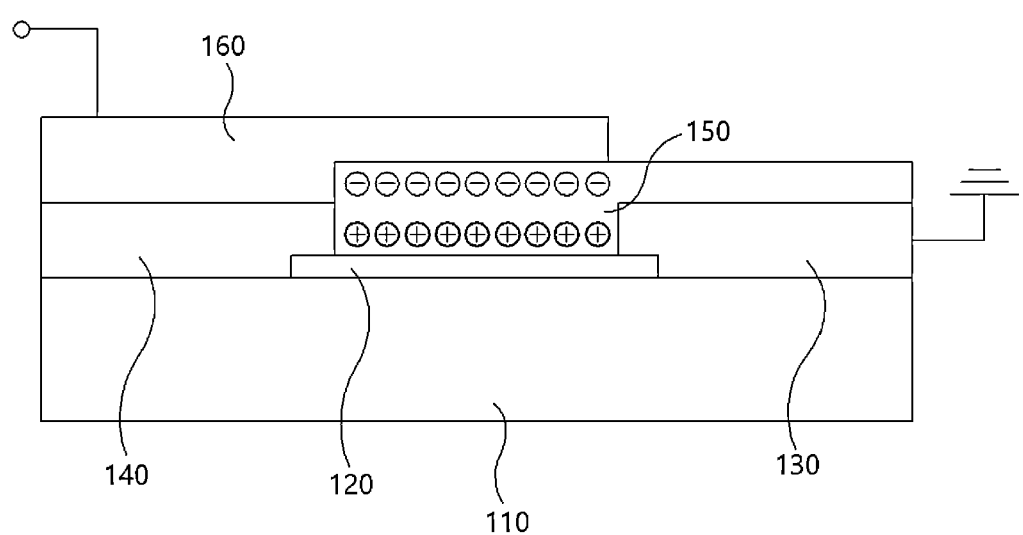
FIG. 2 illustrates a memory device according to a first embodiment of the present disclosure.

FIG. 2 illustrates a memory device according to a first embodiment of the present disclosure. Hereinafter, a two-terminal memory device according to a first embodiment of the present disclosure is described with reference to FIG. 2.

The memory device according to the present disclosure is a device that has the features of a transistor-based synaptic device in which an insulator is substituted with a ferroelectric and has a two-terminal structure unlike the conventional three-terminal structure.

Figure 1:
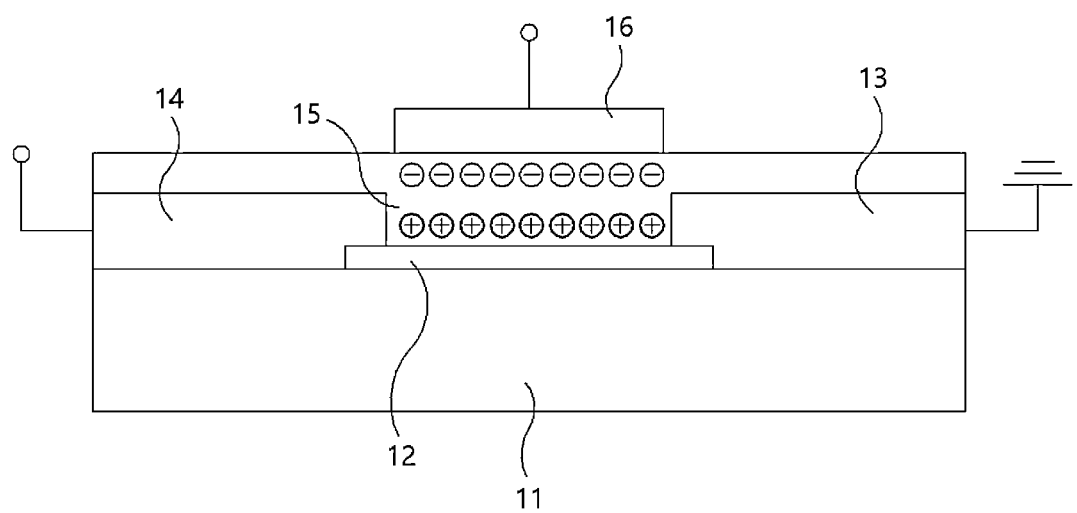
FIG. 1 schematically illustrates a conventional ferroelectric memory device.

Unlike the general three-terminal-based ferroelectric-based synaptic device illustrated in FIG. 1, the memory device according to the present disclosure has a structure in which a drain extends to an upper portion of a ferroelectric to overlap the ferroelectric, and a structure capable of being applied to a cross-point structure, such as a resistance type memristor, by improving an increase in complexity of the three-terminal structure.

The conventional three-terminal ferroelectric memory structure separately uses the gate for adjusting the state of the memory, and the drain/source necessary for confirming the stored state of the memory. In other words, two operations are separately used, but when the structure according to the present disclosure is used, two operations may be implemented even without the gate. As a result, it is possible to perform an analog multiply-accumulate (MAC) operation used for a resistance type memory-based array research. Further, it is possible to implement an operation suitable for implementing a process-in-memory by implementing multiple levels according to the application of the voltage. Such an operation may not be applied to the conventional three-terminal structure.

To this end, the structure according to the present disclosure is composed of a substrate 110, a semiconductor layer 120, a source 130, a drain 140, a ferroelectric layer 150, and an extended drain 160.

The substrate 110 may be formed of a silicon, germanium, or silicon oxide substrate, a glass, a PET film, or the like.

The semiconductor layer 120 formed on the substrate 110 includes a semiconductor material, such as silicon, germanium, group III-V semiconductor, oxide semiconductor, organic semiconductor, transition metal dichalcogenide, or phosphorene.

The source 130 and the drain 140 are laminated to face each other on both sides of an upper surface of the substrate 110, and the source 130 and the drain 140 are connected by the semiconductor layer 120.

The ferroelectric layer 150 is laminated in a form of covering all regions other than the upper surface of the drain 140, including an upper surface of the semiconductor layer 120 between the source 130 and the drain 140.

The ferroelectric layer may be formed by growing, depositing, or directly transferring a material with a spontaneous polarization property, for example, a polymer material, such as polyvinylidene fluoride (PVDF), or an oxide film, such as hafnium zirconium oxide ($HfZrO_2$), haflanthanum oxide ($La:HfO_2$), aluminum (Al):hafnium oxide ($HfO_2$), or silicon (Si):hafnium oxide ($HfO_2$).

Further, according to the present disclosure, the extended drain 160 is formed in a form of covering the drain 140 and a partial region of the ferroelectric layer 150.

In other words, the extended drain 160 has a structure of covering the upper region of the drain 140 and the ferroelectric layer 150 of the region between the drain 140 and the source 130.

The corresponding structure is formed in a form in which the extended drain 160 connected to the drain 140 overlaps a channel region, and therefore, the source 130 may be grounded and the polarization of the ferroelectric layer 150 may be adjusted by an input voltage pulse applied to the drain 140, thereby gradually increasing conductance of the semiconductor channel.

The corresponding structure does not require a new additional process other than the ferroelectric process in the conventional silicon metal oxide semiconductor field effect transistor (MOSFET) process, thereby becoming a very easy form to apply to the industry.

The conventional three-terminal ferroelectric memory may perform only the read operation through the drain, and should perform the write and erase operations through the gate, but the two-terminal ferroelectric memory device according to the present disclosure may perform the write and erase operations as well as the read operation through the drain 140, thereby significantly decreasing complexity upon forming the memory array, thereby being greatly advantageous in forming a high integration memory array. It may be seen that the process is not largely different from that of the conventional three-terminal transistor, thereby being easily used.

Figure 3:
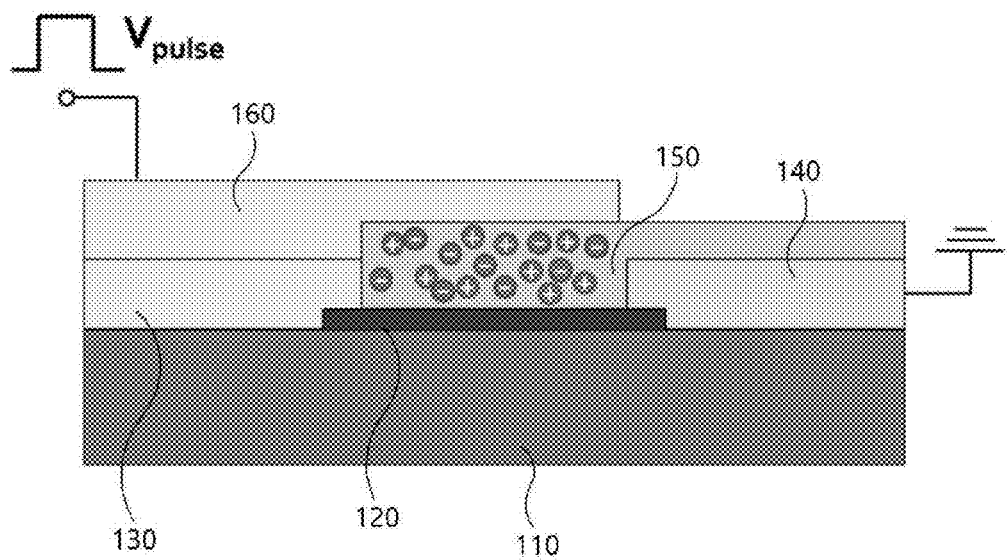
FIG. 3 illustrates an aligned state where a voltage is initially applied to the memory device according to the first embodiment of the present disclosure.

Next, FIG. 3 illustrates an aligned state where a voltage is initially applied to the memory device according to the first embodiment of the present disclosure.

Figure 4:
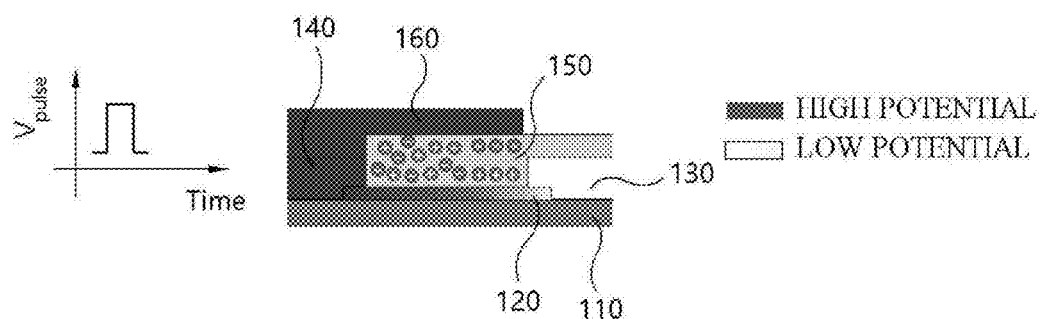
FIGS. 4-6 sequentially illustrate polarization according to the application of a positive voltage to the memory device according to the first embodiment of the present disclosure.
Figure 5:
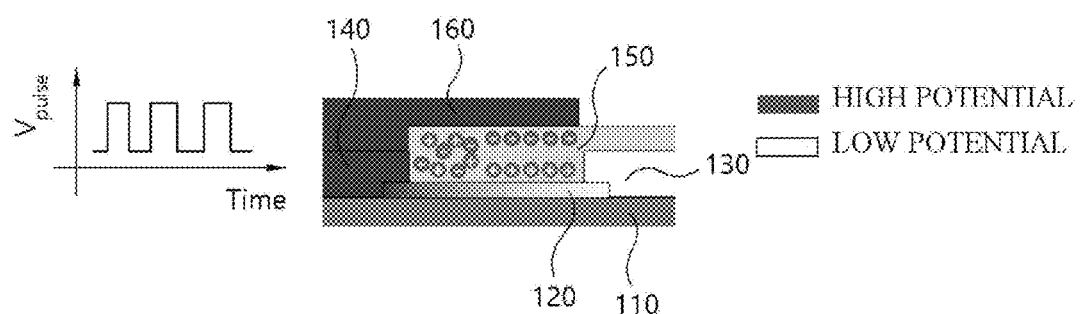
Figure 6:
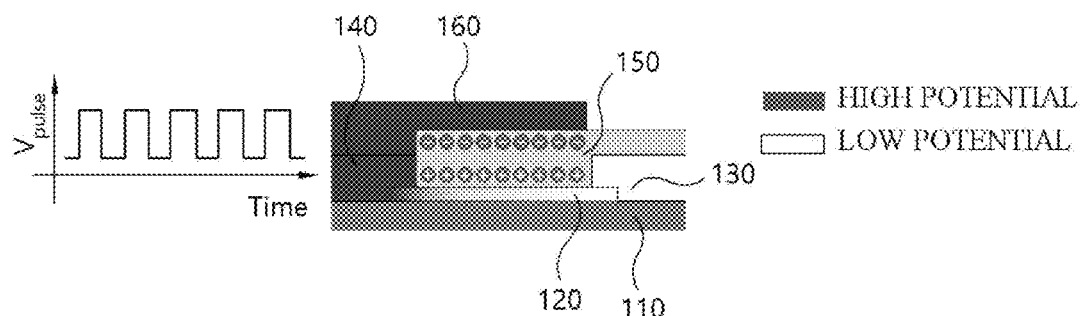
Figure 7:
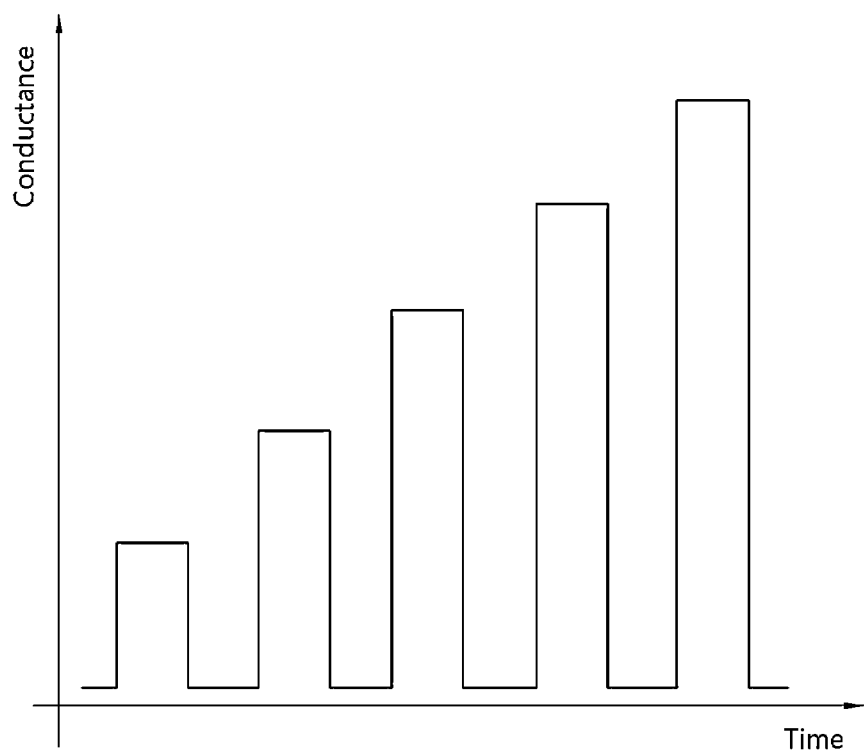
FIG. 7 illustrates a current measurement result when the positive voltage is applied as illustrated in FIGS. 4-6.

FIGS. 4-6 sequentially illustrate polarization according to the application of a positive voltage to the memory device according to the first embodiment of the present disclosure, and FIG. 7 illustrates a measurement result of the electrical conductance that is changed as the positive voltage is applied as illustrated in FIGS. 4-6.

Assume that since the resistance of the channel in the lower region is changed depending upon the alignment of the polarization, a change in the resistance (conductance) inside the channel may be equally operated even if the contact resistance is large.

As illustrated in FIG. 4, before the alignment occurs in the ferroelectric layer 150 initially, a potential of the channel (semiconductor) region may be evenly changed. The alignment of the polarization occurs from the ferroelectric around the source 130 in which a voltage difference is largely caused by the applied input voltage pulse (e.g., +3 V or more, the magnitude of the voltage that is enough to generate the polarization).

FIGS. 4-6 illustrate the height of the voltage difference (potential difference) by expressing the potential of the device with shades (gradation). The height is indicated such that a rapid potential difference may be caused by a voltage distribution phenomenon in a region with a large resistance.

It may be seen that the alignment of the polarization sequentially occurs from the ferroelectric around the source 130.

In other words, when the positive input voltage pulse is sequentially input, the resistance of the channel of the lower portion is decreased while the polarization of the ferroelectric of the region around the source 130 is aligned.

Therefore, in FIGS. 4-6, the gradual increase in the region with the low potential (thin portion) within the channel region means that the resistance of the channel at the corresponding position is decreased by the aligned polarization. A section in which the resistance is decreased is increased from the source 130 toward the drain 140 by the application of the continuous positive input voltage pulse, thereby gradually increasing the electrical conductance of the comprehensive channel.

Referring to the measurement result of the FIG. 7, for example, a change in the electrical conductance of the device may be a current value confirmed by applying the read voltage of +0.1 V. The read voltage has the magnitude of the degree that does not change the resistance of the device and may be determined by a value capable of confirming the electrical conductance (for example, it is an expressed value and may be fluctuated).

It may be seen that the alignment of the polarization is caused by a constant positive input voltage pulse and the electrical conductance may be gradually increased. A synaptic device potentiation operation may be performed by the gradual increase in the electrical conductance and applied to a neuromorphic chip using the above operation.

Figure 8:
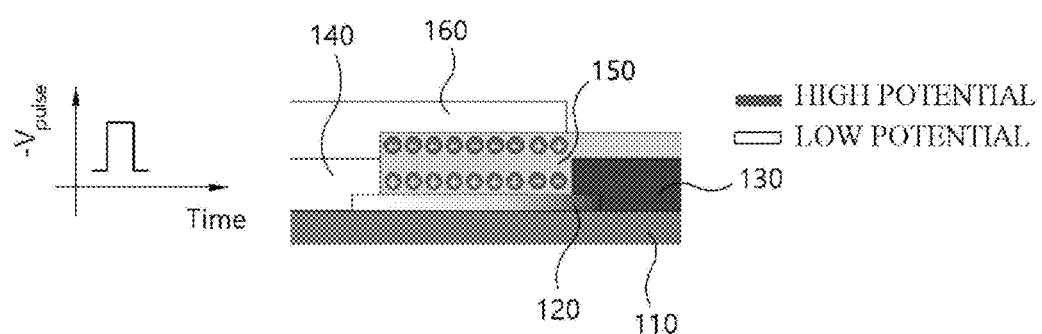
FIGS. 8-10 sequentially illustrate polarization according to the application of a negative voltage to the memory device according to the first embodiment of the present disclosure.
Figure 9:
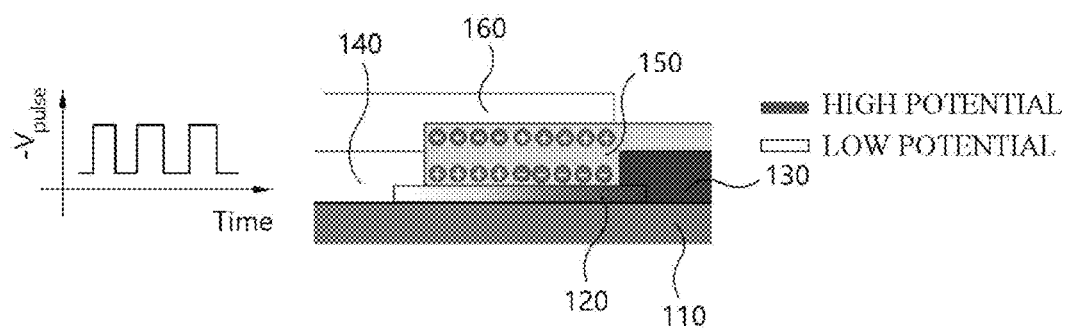
Figure 10:
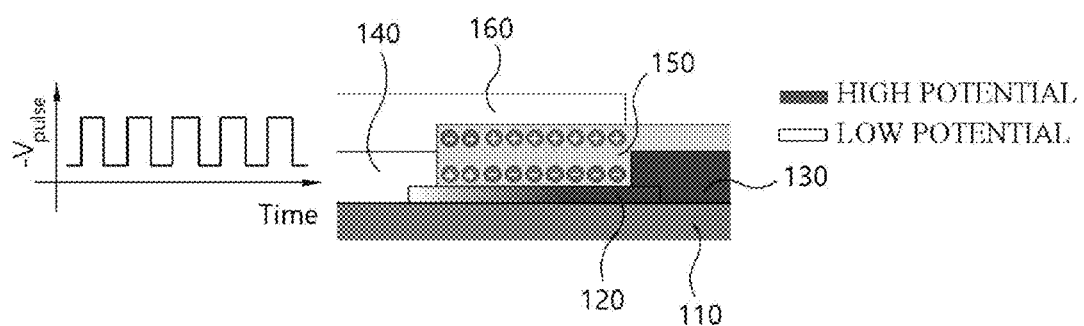
Figure 11:
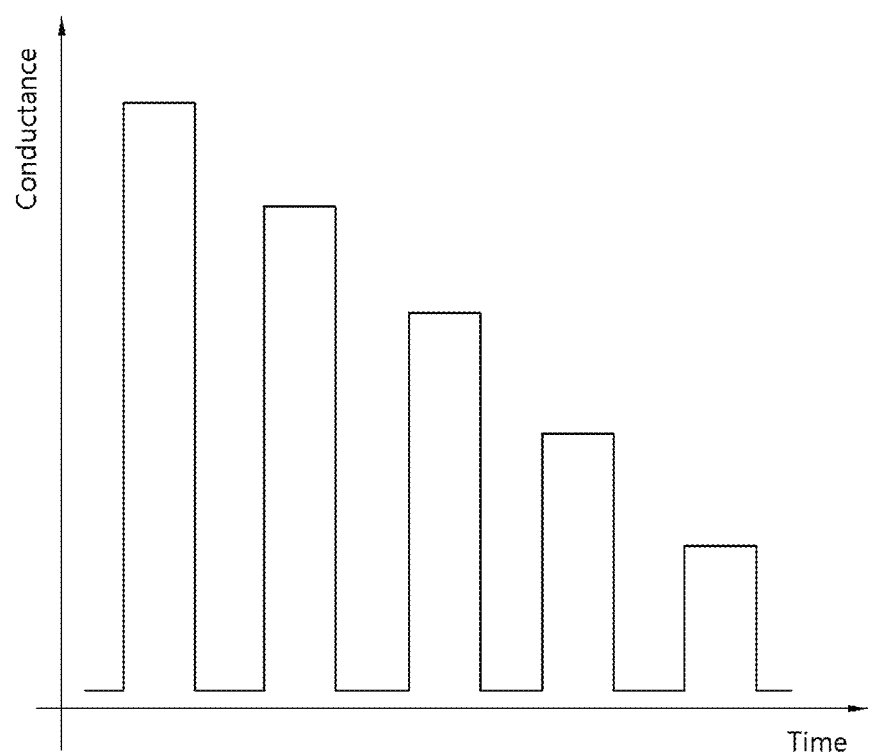
FIG. 11 illustrates a current measurement result when the negative voltage is applied as illustrated in FIGS. 8-10.
Figure 12A:
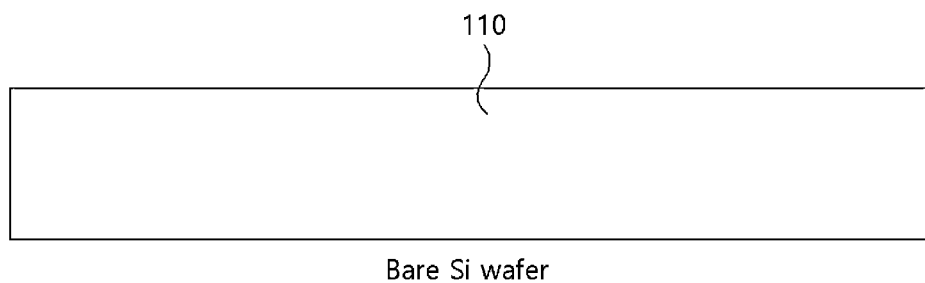
Figure 12B:
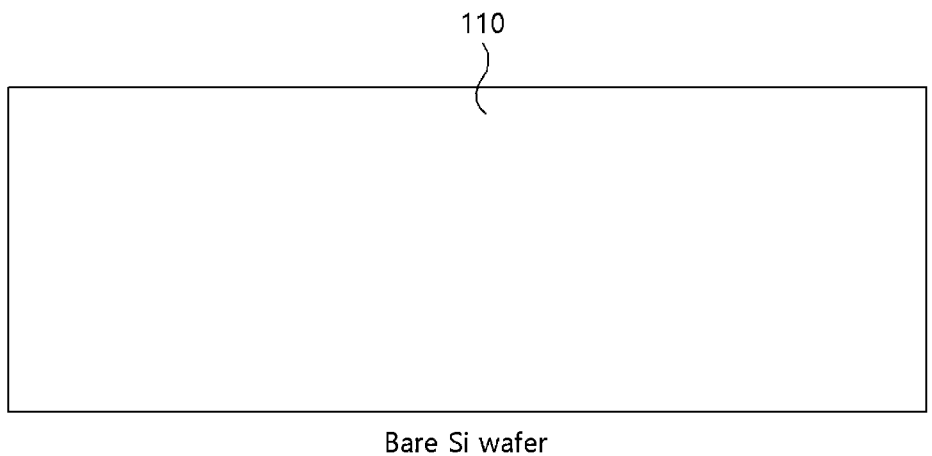
Figure 13A:
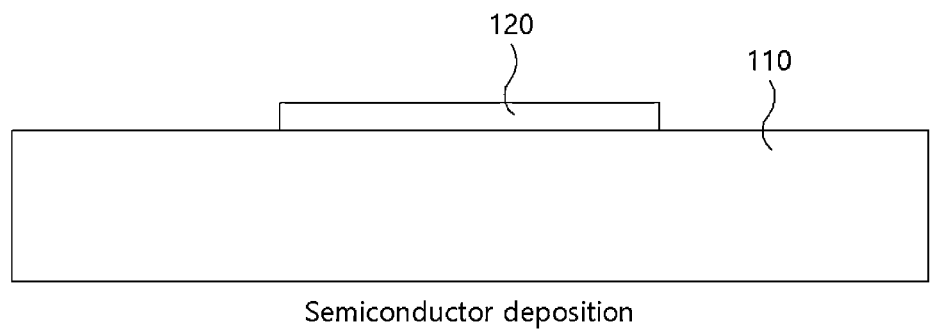
Figure 13B:
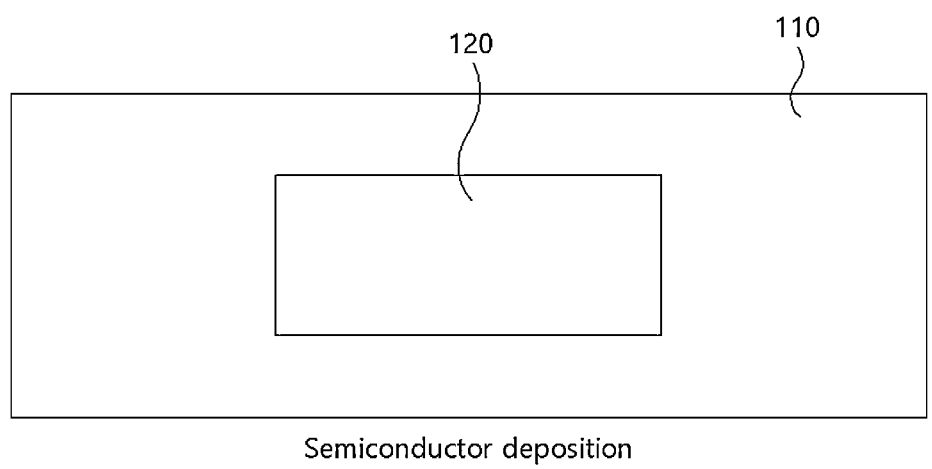
Figure 14A:
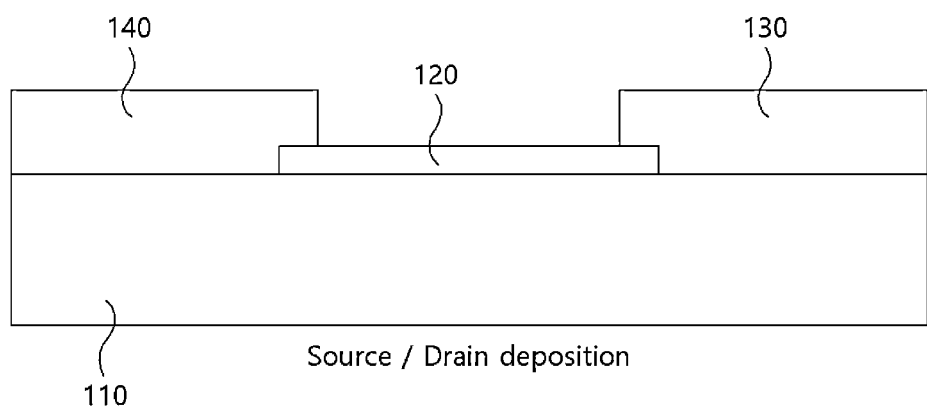
Figure 14B:
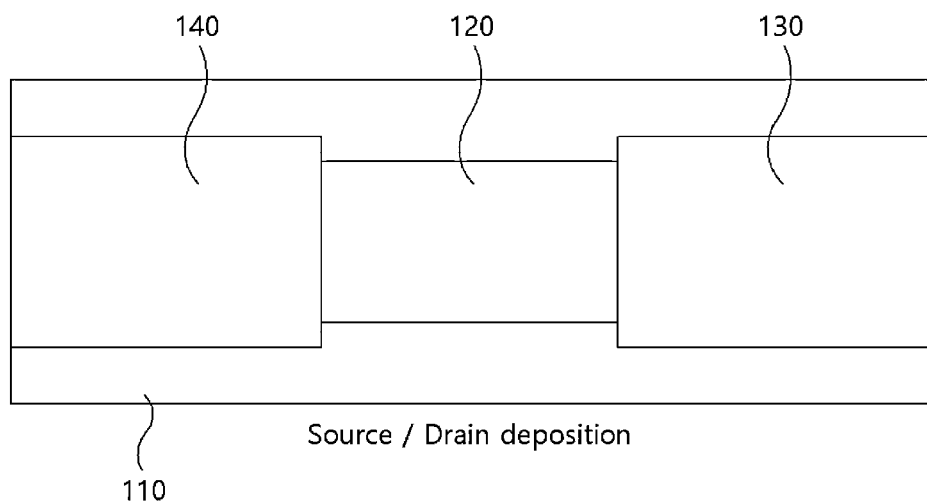
Figure 15A:
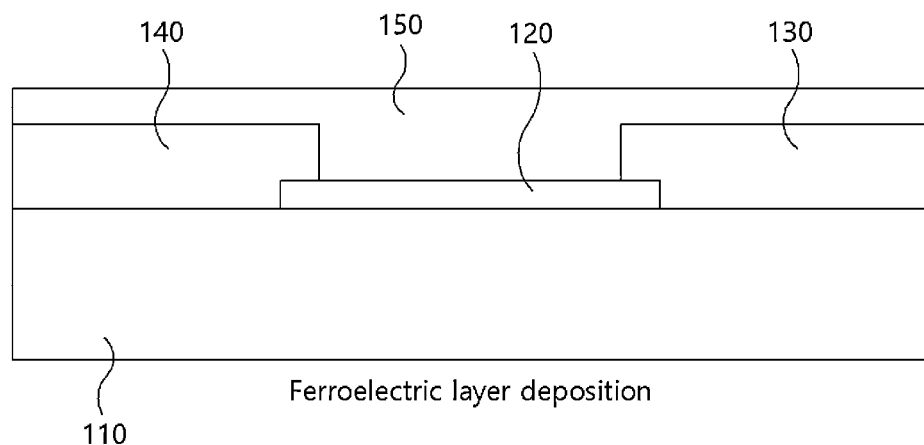
Figure 15B:
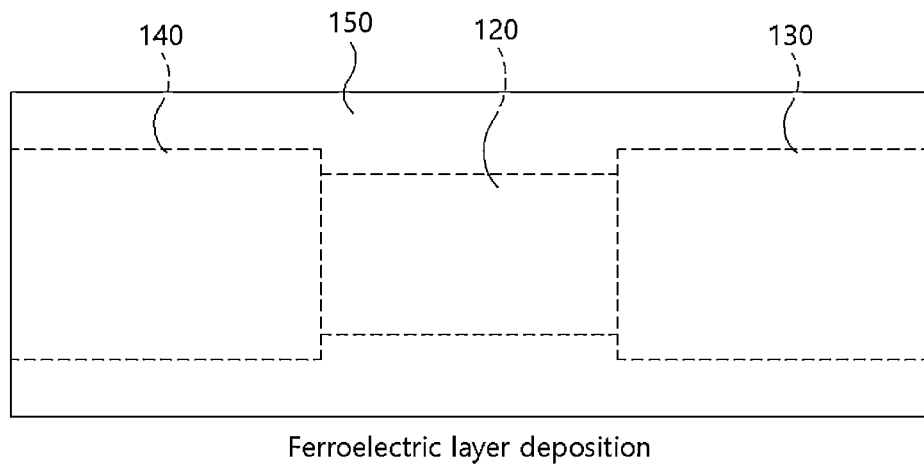
Figure 16A:
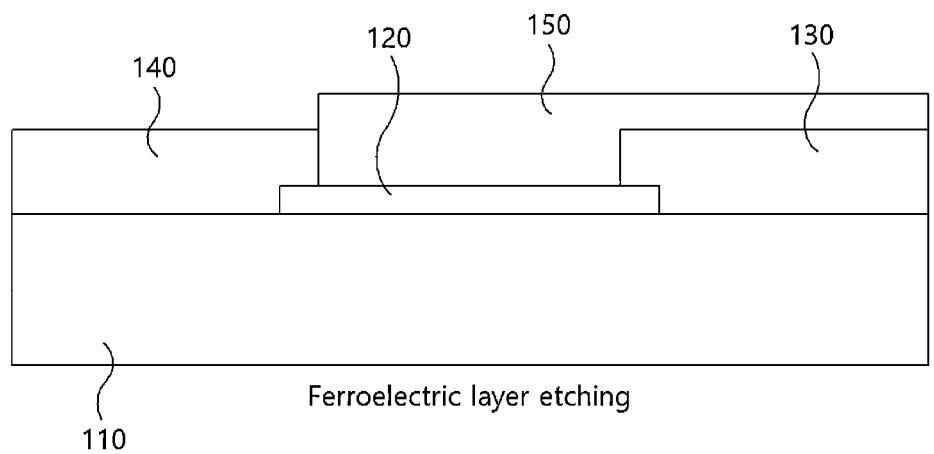
Figure 16B:
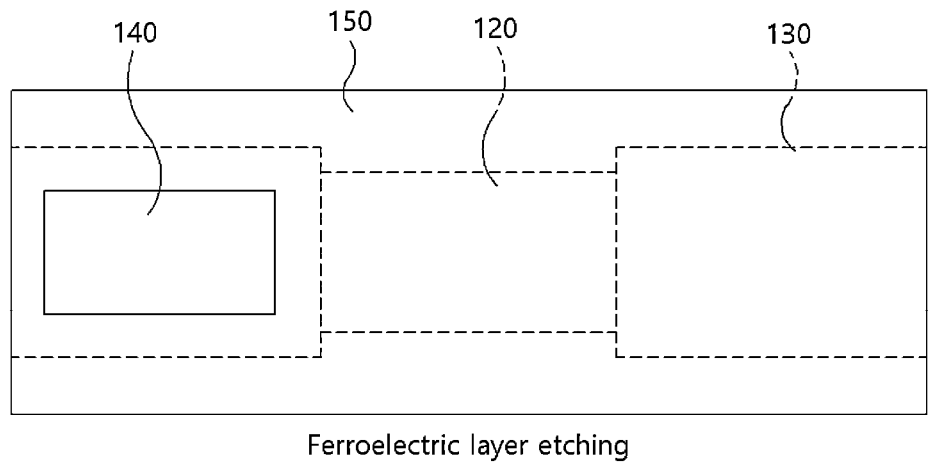
Figure 17A:
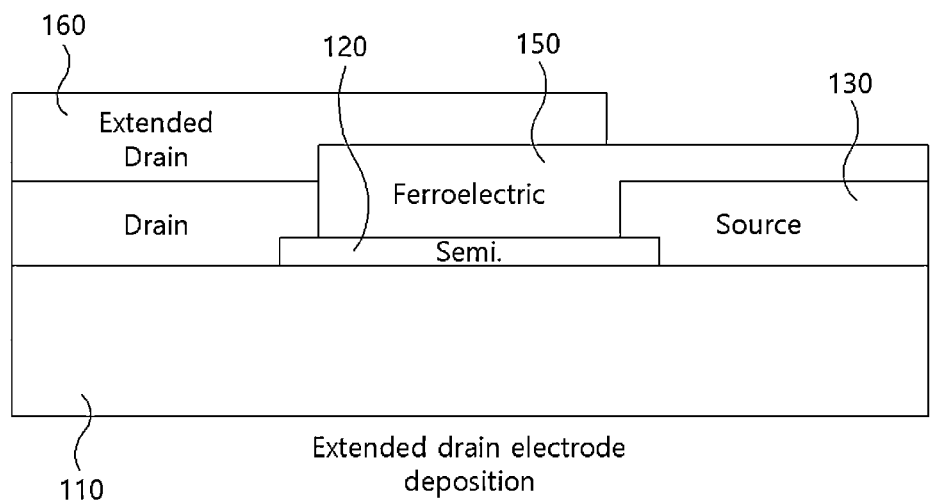
Figure 17B:
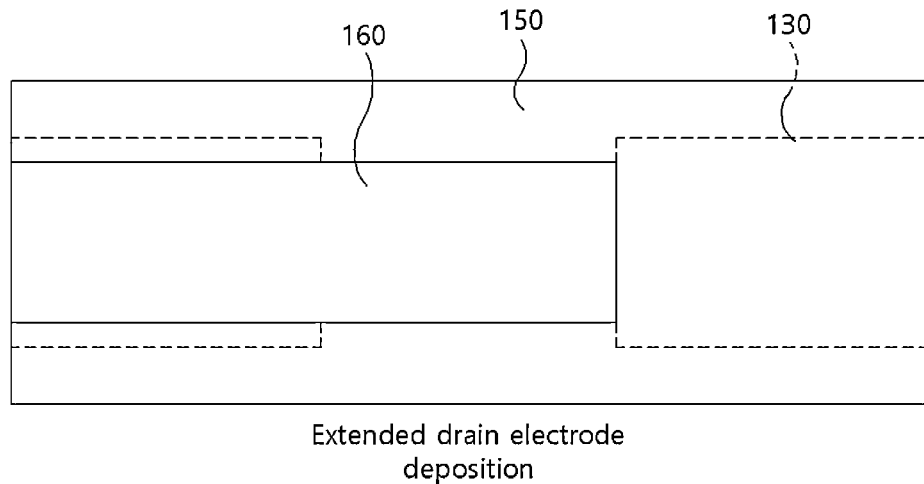

Further, FIGS. 8-10 sequentially illustrate the polarization according to the application of the negative voltage of the memory device according to the first embodiment of the present disclosure. FIG. 11 illustrates the measurement result of the electrical conductance that is changed as the negative voltage is applied as illustrated in FIGS. 8-10.

As illustrated in FIG. 8, to decrease the electrical conductance of the device, a negative input voltage pulse (e.g., −3 V) may be applied to the drain 140 and the ground may be applied to the source 130. Therefore, the drain 140 has a low potential, and the grounded source 130 has a high potential.

The read voltage has the magnitude of the degree that does not change the resistance of the device and may be determined by the value capable of confirming the electrical conductance.

It may be seen that the alignment of the polarization occurs from the ferroelectric around the source 130 in which the voltage difference is largely caused by the applied input pulse.

Therefore, a rapid potential difference is caused by the voltage distribution property as the resistance of the semiconductor channel in the corresponding region increases. When the negative input voltage pulse is input, the resistance of the channel at the corresponding position is increased as the polarization is sequentially aligned from the source 130 toward the drain 140, thereby gradually decreasing the resistance of the channel as illustrated in FIG. 11.

A synaptic device depression operation may be performed by the gradual decrease in the electrical conductance and may be applied to the neuromorphic chip using the above operation.

Next, FIGS. 12A-17B sequentially illustrate a method for manufacturing the memory device according to the first embodiment of the present disclosure. FIGS. 12A, 13A, 14A, 15A, 16A, and 17A illustrate shapes of side surfaces of the memory device, and FIGS. 12B, 13B, 14B, 15B, 16B, and 17B illustrate shapes of upper surfaces thereof.

Hereinafter, a method for manufacturing the memory device according to the first embodiment of the present disclosure is described with reference to FIGS. 12A-17B.

First, the substrate 110 (e.g., bare Si wafer) is provided, and the semiconductor layer 120 is deposited on the substrate 110.

Further, the source 130 and the drain 140 are deposited and formed to face each other on both sides of the upper surface of the substrate 110, and each of a part of the source 130 and a part of the drain 140 is connected to the semiconductor layer 120.

Then, the ferroelectric layer 150 is deposited to entirely cover the substrate 110, the semiconductor layer 120, the source 130, and the drain 140.

Further, the ferroelectric layer 150 covering the upper surface of the drain 140 is etched.

Then, the extended drain 160 is formed. The extended drain 160 is manufactured by being deposited to cover the upper region of the drain 140 and the ferroelectric layer 150 of the region between the drain 140 and the source 130.

Figure 18:
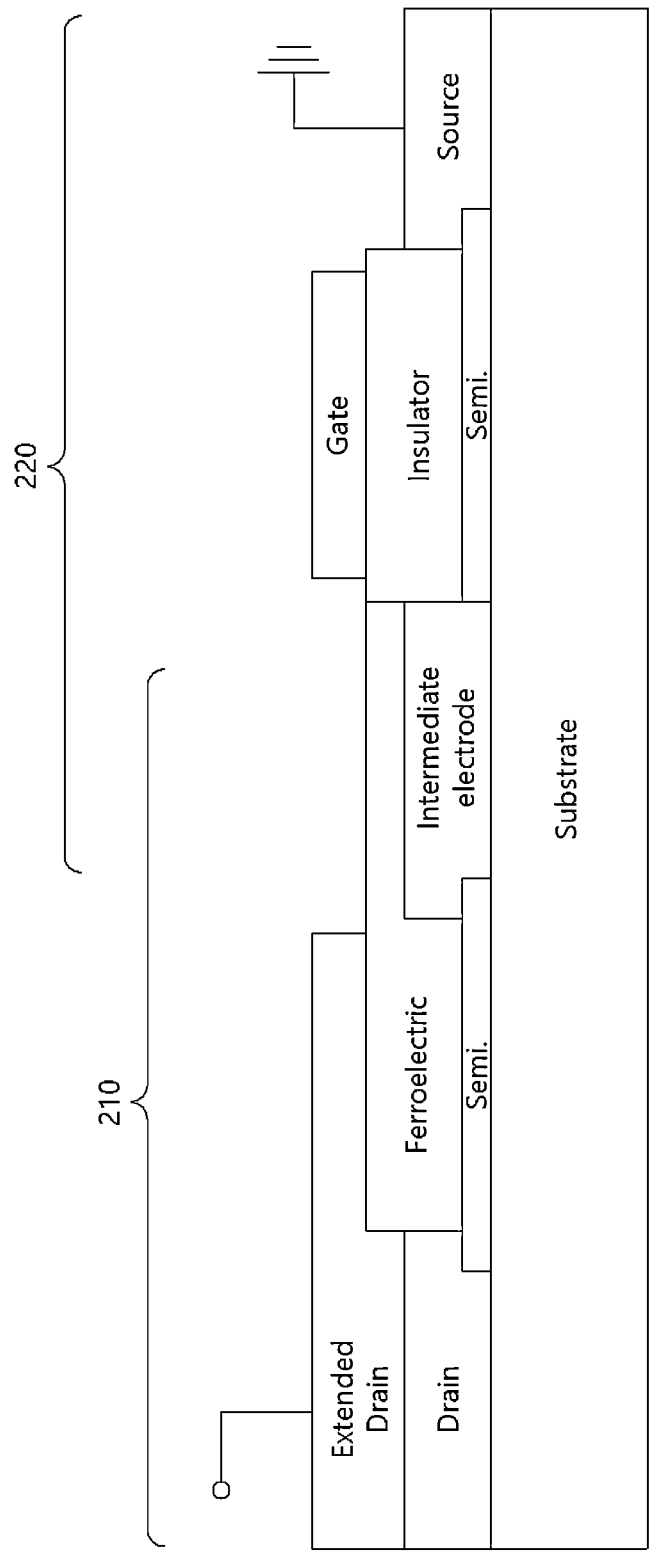
FIG. 18 illustrates a semiconductor device according to a first application embodiment of the present disclosure.

Next, FIG. 18 illustrates a semiconductor device according to a first application embodiment of the present disclosure.

A semiconductor device according to a first application embodiment of the present disclosure may be formed in a 1Transfer1Receiver (1T1R) form in which a memory device 210 according to the aforementioned first embodiment is positioned on a left portion of an upper end of the substrate and a MOSFET device 220 is positioned on a right portion thereof, in which a source of a central portion thereof, as an intermediate electrode, is shared by the respective devices.

It is possible to solve a leakage current problem that occurs upon forming the cross-point array by adjusting a gate voltage of the MOSFET device 220 connected to the two-terminal memory device 210.

The two-terminal ferroelectric memory positioned on the left portion has the semiconductor region (Semi.) on the substrate and the ferroelectric on the semiconductor region (Semi.), and has the drain, the intermediate electrode, and the extended drain positioned on both ends of the two-terminal ferroelectric memory.

Further, the MOSFET device 220 positioned on the right portion shares the intermediate electrode, and has a semiconductor region (Semi.) positioned on the substrate, a source (may be referred to as a MOSFET source for distinguishing it from the source of the two-terminal memory device) connected to the semiconductor region (Semi.) disposed on the right of the MOSFET device 220, and an insulator and a gate sequentially positioned on the semiconductor region (Semi.).

Upon manufacturing the corresponding structure, since the processes other than the ferroelectric and insulator processes may be performed together due to the similar structural features, there also exists an advantage in that the process is simplified.

Figure 19:
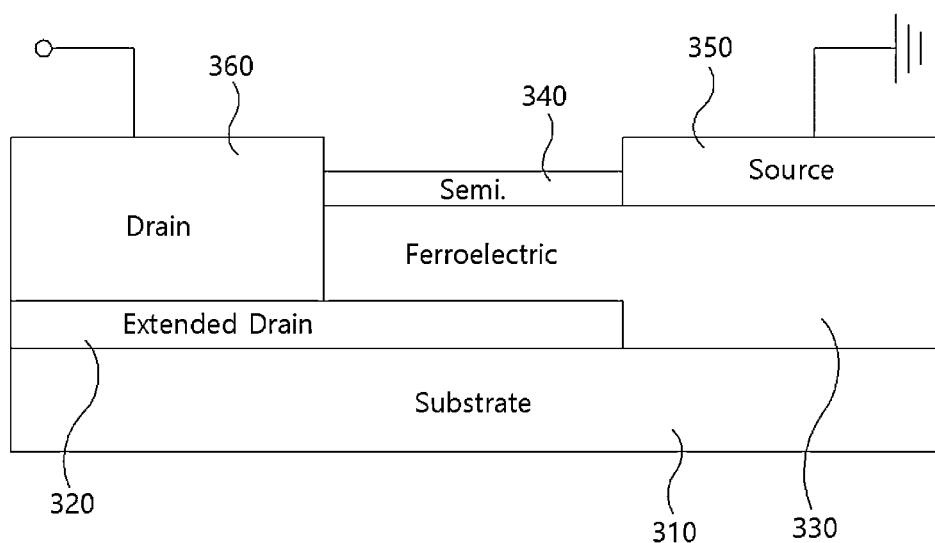
FIG. 19 illustrates a memory device according to a second embodiment of the present disclosure.

Next, FIG. 19 illustrates a memory device according to a second embodiment of the present disclosure.

As illustrated, a memory device according to a second embodiment has a drain 360 and a source 350 positioned on both ends of the device, and an extended drain 320 positioned on one side of the upper end of the substrate 310. The ferroelectric layer 330 is formed on the substrate 310 while partially covering the extended drain 320 and formed by being etched to cover the region other than the region of the drain 360.

A semiconductor layer (semiconductor channel) 340 is formed on the ferroelectric layer 330 in an upward direction corresponding to the extended drain 320. Also, the source 350 is formed on the ferroelectric layer 330 on one side or end of the semiconductor layer 340 and the drain 360 is formed on the extended drain 320 on the other side or end of the semiconductor layer 340.

The changed point of the operation of the device is not caused by the changed structure, and the thickness of the insulator between the extended drain 320 and the source 350 may be easily secured, thereby minimizing the influence of the undesired leakage current.

Figure 20:
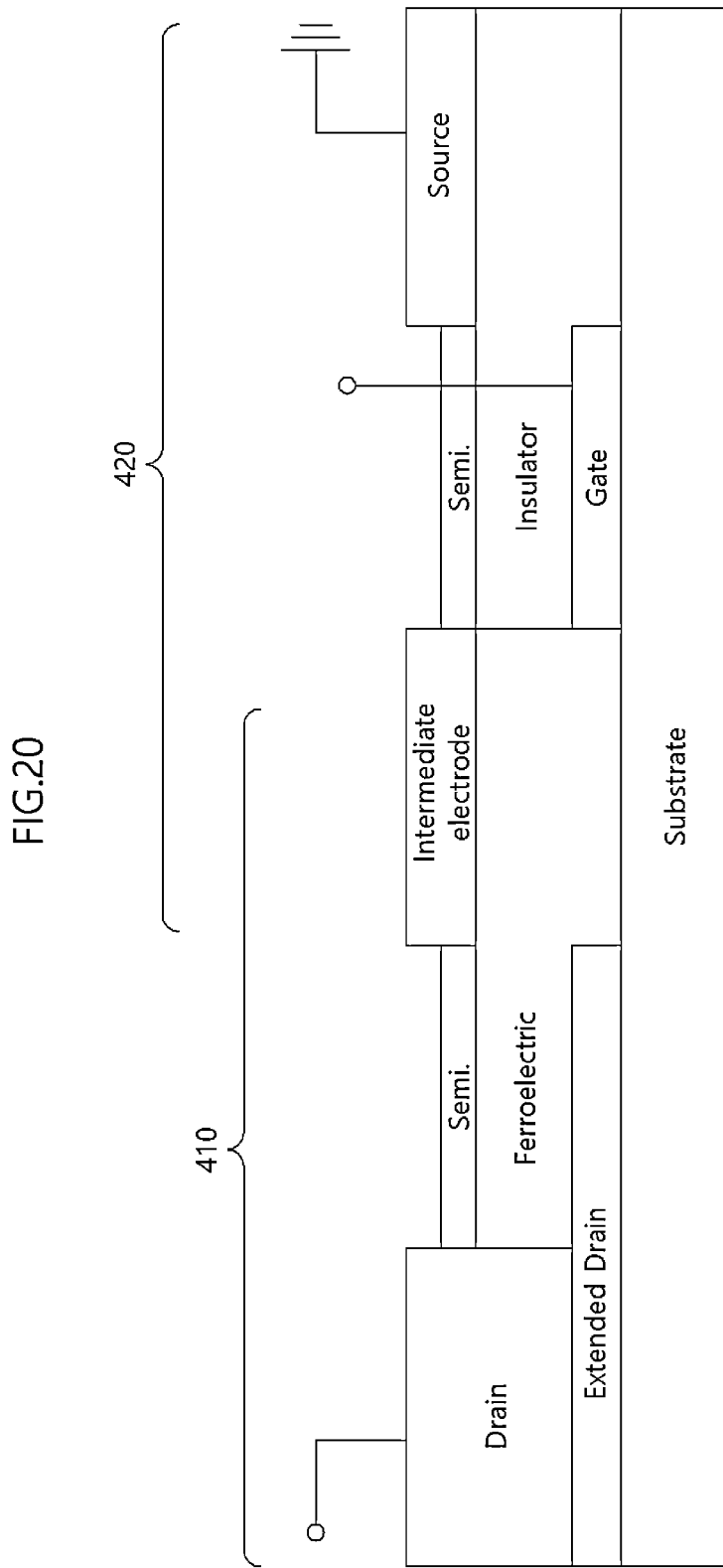
FIG. 20 illustrates a semiconductor device according to a second application embodiment of the present disclosure.

FIG. 20 illustrates a semiconductor device according to a second application embodiment of the present disclosure illustrated in FIG. 19.

Similar to the first application embodiment of the present disclosure, the second application embodiment of the present disclosure has a memory device 410 according to the second embodiment positioned on a left portion of the upper end of the substrate and a MOSFET device 420 positioned on a right portion thereof.

The two-terminal ferroelectric memory positioned on the left portion has an extended drain positioned on the substrate, and a ferroelectric layer positioned on the extended drain. The two-terminal ferroelectric memory has a structure of the form (bottom gate form) that has a drain connected to the extended drain, a semiconductor layer (Semi.), and an intermediate electrode disposed therein, has a gate, an insulator, and the semiconductor layer (Semi.) sequentially disposed on the substrate at the right portion thereof, and has the intermediate electrode and the source (may be referred to as a MOSFET source for distinguishing it from the source of the two-terminal memory device) contacting the semiconductor layer (Semi.).

Through the corresponding structure, it is possible to implement the 1T1R structure, and to easily secure the thickness of the insulator between the extended drain and the intermediate electrode, thereby minimizing the influence of the undesired leakage current.

Figure 21:
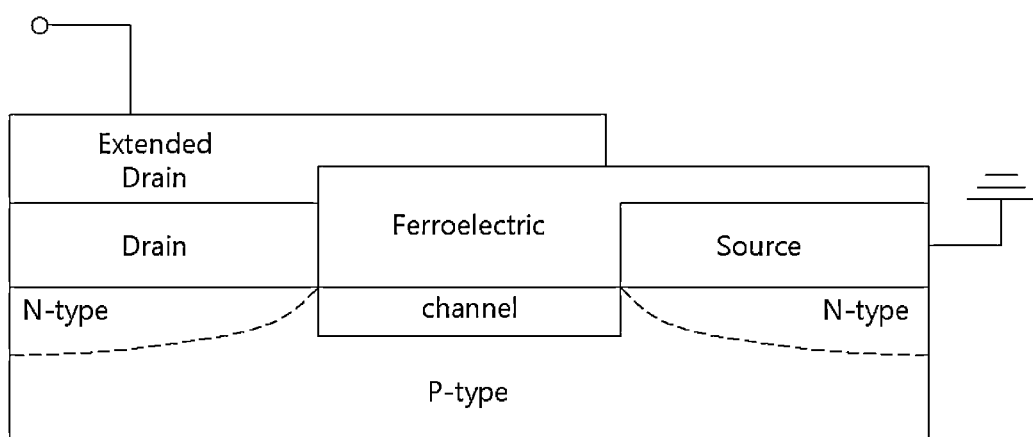
FIG. 21 illustrates a memory device according to a third embodiment of the present disclosure.

Lastly, FIG. 21 illustrates a memory device according to a third embodiment of the present disclosure. The same description as that of the aforementioned first embodiment is be omitted.

A memory device according to a third embodiment may have a channel region formed in a region of an upper end of a substrate (P-type).

A doping concentration of the substrate (semiconductor) may be adjusted into an N or P type using, for example, an ion implantation technique and the channel region may be formed on a lower end of a ferroelectric layer depending upon the alignment degree of the polarization of the ferroelectric layer.

The present disclosure has been described above with reference to the drawings but is not limited to the described embodiments. It should be apparent to those having ordinary skill in the art that various modifications and changes may be made without departing the spirit and scope of the present disclosure. Therefore, the modified examples or the changed examples are included in the claims of the present disclosure, and the scope of the present disclosure should be interpreted based on the appended claims.

What is claimed is:

1. A two-terminal memory device comprising:
a substrate;
a source and a drain formed to face each other on an upper surface of the substrate;
a ferroelectric layer connected to the source and the drain, and formed between the source and the drain; and
an extended drain extending from the drain and laminated on an upper surface of the ferroelectric layer.

2. The two-terminal memory device of claim 1,
wherein the extended drain covers an upper region of the drain and the ferroelectric layer of a region between the source and the drain.

3. The two-terminal memory device of claim 2,
wherein the ferroelectric layer is laminated in a form of covering the substrate, the source, and the drain other than the extended drain.

4. A semiconductor device comprising:
the two-terminal memory device of claim 3;
a metal oxide semiconductor field effect transistor (MOSFET) source sharing a source as an intermediate electrode, and formed on the substrate to face the intermediate electrode;
an insulator formed between the intermediate electrode and the MOSFET source; and
a gate formed on the insulator.

5. The two-terminal memory device of claim 2,
wherein the ferroelectric layer is made of a material with a spontaneous polarization property.

6. The two-terminal memory device of claim 5,
wherein the ferroelectric layer is made of an oxide film consisting of any one material of polyvinylidene fluoride (PVDF), or an oxide material, such as hafnium zirconium oxide ($HfZrO_2$), haflanthanum oxide (La:$HfO_2$), aluminum (Al):hafnium oxide ($HfO_2$), or silicon (Si):hafnium oxide ($HfO_2$).

7. The two-terminal memory device of claim 2, further comprising:
a semiconductor layer connected to the source and the drain, and laminated on the substrate,
wherein the ferroelectric layer is laminated on an upper surface of the semiconductor layer.

8. The two-terminal memory device of claim 2,
wherein the polarization of the ferroelectric layer is adjusted by an input voltage pulse applied to the drain.

9. The two-terminal memory device of claim 8,
wherein an electrical conductance of a channel region between the source and the drain is linearly changed depending upon a change in the input voltage pulse.

* * * * *